(12) United States Patent
Lin et al.

(10) Patent No.: US 6,169,039 B1
(45) Date of Patent: Jan. 2, 2001

(54) ELECTRON BEAN CURING OF LOW-K DIELECTRICS IN INTEGRATED CIRCUITS

(75) Inventors: Ming-Ren Lin, Cupertino; Shekhar Pramanick, Fremont; David Bang, Palo Alto, all of CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/187,169

(22) Filed: Nov. 6, 1998

(51) Int. Cl.[7] .................................................. H01L 21/31
(52) U.S. Cl. ........................ 438/761; 438/782; 438/788
(58) Field of Search ................................ 438/761, 763, 438/782, 788

(56) References Cited

U.S. PATENT DOCUMENTS

| | | | |
|---|---|---|---|
| 5,723,908 | * | 3/1998 | Fuchida et al. ........................ 257/758 |
| 5,972,803 | * | 10/1999 | Shu et al. .............................. 438/781 |
| 5,989,983 | * | 11/1999 | Goo et al. .............................. 438/473 |

OTHER PUBLICATIONS

Zhao, B. Advanced Interconnect Systems for ULSI Technology, Proceedings on the 1998 5th International Conference on Solid–State and Integrated Circuit Technology. Oct. 21–23, 1998. pp. 43–46.

Hui, J.C.M. et al.. Integration of Low k Spin–on Polymer (SOP) Using Electron Beam Cure For Non–Etch–Back Application. 1998 Proceedings of the IEEE International Interconnect Technology Conference. Jun. 1–3, 1998. pp. 217–219.

\* cited by examiner

*Primary Examiner*—Olik Chaudhuri
*Assistant Examiner*—Ginette Peralta
(74) *Attorney, Agent, or Firm*—Foley & Lardner

(57) ABSTRACT

An integrated circuit and a method of forming an integrated circuit is described. The integrated circuit includes a silicon substrate, a dielectric stack formed on the silicon substrate, and conductive metal lines overlying the silicon substrate. A first layer of low-k dielectric material overlies the at least one conductive metal line, and a second layer of low-k dielectric material overlies the first layer of low-k dielectric material. The first layer of low-k dielectric material is electron beam (E-beam) cured and the second layer of low-k dielectric material is thermally cured.

21 Claims, 1 Drawing Sheet

ELECTRON BEAN CURING OF LOW-K DIELECTRICS IN INTEGRATED CIRCUITS

FIELD OF THE INVENTION

This invention relates to the fabrication of integrated circuits, and more particularly to forming low dielectric constant insulating layers between metal conductive lines that provide the interconnection between the active or passive elements of the integrated circuit. Further, the invention relates to the novel integrated circuit structures resulting therefrom.

BACKGROUND OF THE INVENTION

In very large scale integrated (VLSI) circuit devices, several wiring layers are required to connect together the active or passive elements in a VLSI semiconductor chip. The interconnection structure consists of thin conductive lines separated by insulation in one layer or level and connected through vias or studs from contacts of the elements of the semiconductor chip or to a similar layer in another level of interconnections. This interconnection structure is similar to a transmission line in that there is a propagation delay of the signals being transmitted in these wiring layers. The delay is referred to as RC delay because it generally relates to the resistance (R) of the material of the wire and the capacitance (C) between adjacent wires.

With the trend of higher and higher levels of integration in integrated circuits to ultra large scale integrated (ULSI) circuits, the space or gap between the conductive lines that is to be filled with insulation is becoming extremely narrow between some of the conductive lines, such as those that are about 0.5 microns and smaller. Such a narrow space or gap between conductive lines increases the capacitance and places greater demands on the insulating properties of the insulation between such conductive lines. Capacitance (C) is the product of dielectric constant of the insulting material times the area (A) of the opposing faces of the conductive line divided by the distance (D) between the conductive lines. With a decrease in distance (D), the capacitance (C) increases. Since signal delay of signals transmitted on the conductive line is controlled by the (RC) constant, an increase in capacitance (C) degrades the performance of the integrated circuit.

At present, thermal curing is the conventional approach for curing dielectric materials having a low dielectric constant (hereinafter referred to as low-k dielectric material). However, electron beams have also been used to cure low-k dielectric materials such as spin on glass (SOG), benzocyclobutine (BCB), and hydrogen silsesquioxanes (HSQ). Electron beam curing has advantages over conventional heat curing in that it produces low-k dielectric materials resistant to moisture and resistant to subsequent heating, and it adds mechanical strength.

However, a disadvantage of electron beam curing is that the dielectric constant of the low-k material is increased by the electron beam curing process. Because the dielectric constant of the low-k material is increased, correspondingly parasitic capacitance between conductive lines also increases. The increase in parasitic capacitance between conductive lines has a direct negative impact on VLSI and ULSI circuit performance.

Additionally, it is often necessary to etch vias through dielectric layers above conductive lines. Misalignment of the vias may cause etching through the dielectric material against the metal side wall of the conductive lines. This over etching causes a decrease in the insulating properties of the dielectric layer and an increase on the overall parasitic capacitance between the metal conductive lines.

Thus, there is a need and desire for a method of producing integrated circuits, including VLSI and ULSI circuit devices, that gain the advantages of electron beam curing of low-k dielectric materials while minimizing the negative impact of the increased dielectric constant. There is a need and desire for an integrated circuit having an insulating layer that will provide moisture resistance, thermal resistance, and mechanical support to metal conductive lines, but will only have a minor impact on the overall parasitic capacitance between metal conductive lines.

Further, there is a need and desire for a method of producing integrated circuit devices that minimize the yield loss due to metal-metal bridging between metal lines during subsequent processing that is caused by over etching against the side wall of metal lines in the process of etching vias or contacts, due to the misalignment of the vias or contacts.

Further still, there is a need and desire for an integrated circuit device having conductive lines separated by low-k dielectric materials that are resistant to moisture, resistant to subsequent heating steps, and mechanically strengthened, while maintaining a low parasitic capacitance between conductive lines.

SUMMARY OF THE INVENTION

The present invention relates to a method of making an insulating material on an integrated circuit. The integrated circuit has a silicon substrate, a dielectric stack formed on the silicon substrate, and at least one conductive metal line overlying the silicon substrate. The method includes depositing a first layer of low-k dielectric material to cover the at least one conductive metal line, exposing the first layer of low-k dielectric to an electron beam (E-beam), and depositing a second layer of low-k dielectric material to cover the first layer of low-k dielectric material.

The present invention further relates to an integrated circuit including a silicon substrate, a dielectric stack formed on the silicon substrate, at least one conductive metal line overlying the silicon substrate, a first layer of low-k dielectric material overlying the at least one conductive metal line, and a second layer of low-k dielectric material overlying the first layer of low-k dielectric material. The first layer of low-k dielectric material is electron beam (E-beam) cured.

The present invention still further relates to a method of forming an insulating material on a patterned surface of conductive lines separated by gaps and formed on a substrate. The method includes depositing a first layer of low-k dielectric material around the metal lines, curing the first layer of low-k dielectric material by exposing the low-k dielectric material to an electron beam, and depositing a second layer of low-k dielectric material over the first layer of low-k dielectric material.

The present invention still further relates to a method of forming an integrated circuit on a dielectric stack. The dielectric stack includes a silicon substrate underlying a first layer of low-k dielectric. The first layer of low-k dielectric underlies an electron-beam (E-beam) cured second layer of low-k dielectric. The method of forming the semiconductor includes forming conductive lines on the dielectric stack by selective etching, depositing a third layer of low-k dielectric material around the metal lines, curing the third layer of low-k dielectric material by exposing the third layer of low-k dielectric material to an electron beam, and depositing a fourth layer of low-k dielectric material over the third layer of low-k material.

BRIEF DESCRIPTION OF THE DRAWINGS

The invention will hereafter be described with reference to the accompanying drawings, wherein like reference numerals denote like elements in the various drawings, and.

DETAILED DESCRIPTION OF THE PREFERRED EMBODIMENT

Figure 1:
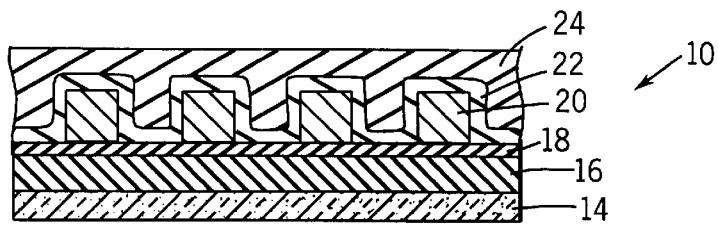
FIG. 1 is a cross sectional view of a portion of an integrated circuit having a heat cured dielectric layer deposited over a thin dielectric layer, which is disposed over metal conductive lines on a dielectric stack.

Referring to FIG. 1 a portion of an integrated circuit 10 is shown. Integrated circuit 10 includes a silicon substrate 14, a low-k dielectric layer 16, an electron beam cured low-k dielectric layer 18, a multiplicity of metal conductive lines 20, a second electron beam cured low-k dielectric layer 22, and a thermally cured low-k dielectric layer 24. Metal conductive lines 20 may be formed using a conventional deposition and photoresistive reactive ion etching technique or any other suitable method of forming conductive metal lines. Metal conductive lines 20 may be made of aluminum, copper, or alloys of aluminum or copper, or other suitable materials. Low-k dielectric layer 22 is an electron beam (E-beam) cured low-k dielectric layer. The low-k dielectric material is deposited to form a thin layer over metal conductive lines 20. Low-k dielectric layer 22 may be made of SOG, BCB, HSQ, or any other suitable materials.

FIG. 1 depicts integrated circuit 10 having a thin e-beam cured low-k dielectric layer 22 disposed over conductive lines 20. Low-k dielectric layer 24 is disposed on low-k dielectric layer 22. Low-k dielectric layer 24 is a conventional heat cured low-k dielectric layer. Low-k dielectric layer 24 may be made from SOG, BCB, HSQ, or any other suitable material.

Figure 2:
FIG. 2 is a cross sectional view of the dielectric stack on a silicon substrate.
Figure 3:
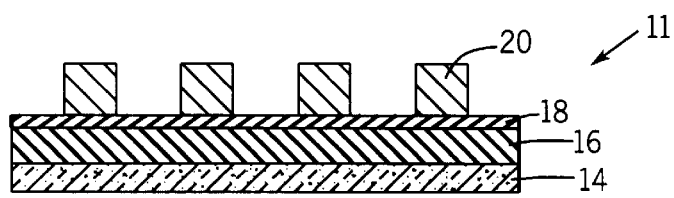
FIG. 3 is a cross sectional view of the dielectric stack illustrated in FIG. 2 having conductive lines deposited thereon.
Figure 4:
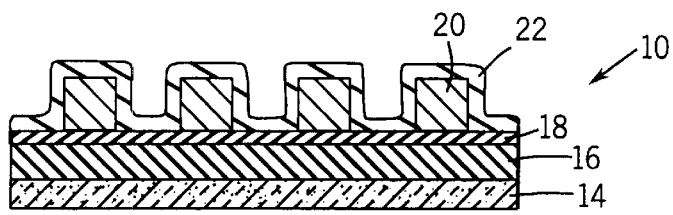
FIG. 4 is a cross sectional view of the device of FIG. 3 having a thin dielectric layer deposited thereon.

FIGS. 2–4 depict the process of forming integrated circuit 10 of FIG. 1. Conductive lines 20 (FIG. 3) are disposed on a dielectric stack 11 (shown in FIG. 2), dielectric stack 11 being disposed on a silicon substrate 14. The dielectric stack includes a low-k dielectric layer 16 and a second low-k dielectric layer 18. Low-k dielectric layer 16 is disposed on silicon substrate 14. Low-k dielectric layer 18 is disposed on low-k dielectric layer 16. Low-k dielectric layer 16 may be a conventional heat cured low-k dielectric layer. Low-k dielectric layer 16 may be composed of SOG, BCB, HSQ, or any other suitable low-k dielectric material. Low-k dielectric layer 16 may have a thickness of approximately 0.30 micrometers in a preferred embodiment but may alternatively have a wide range of thicknesses without departing from the spirit and scope of the present invention.

Low-k dielectric layer 18, being disposed on low-k dielectric layer 16, may, in a preferred embodiment, be an electron beam cured low-k dielectric made of materials similar to or different from low-k dielectric layer 16. Layer 18 may have a thickness of approximately 0.03 micrometers, in a preferred embodiment but may alternatively have a wide range of thicknesses without departing from the spirit and scope of the present invention.

In an alternative embodiment dielectric stack 11 does not include low-k dielectric layer 18, that is dielectric stack 11 may consist of a low-k dielectric layer 16 alone.

As depicted in FIG. 3, a multiplicity of conductive lines 20 are formed on dielectric stack 11. In a preferred embodiment the conductive lines are formed from metals or metal alloys, such as, but not limited to copper, copper alloys, aluminum, aluminum alloys, or other suitable conductive materials. Also, in a preferred embodiment conductive lines 20 are formed by a process of depositing the metal or metal alloy on dielectric stack 11, planarizing the surface of the metal or metal alloy, masking the surface of the metal or metal alloy with photo resist, chemically selectively etching the non masked regions of the metal or metal alloy, and chemically stripping the photoresist from the surface of the remaining metal or metal alloy.

As depicted in FIG. 4 a thin layer of low-k dielectric 22 is deposited over metal conductive lines 20. Low-k dielectric layer 22 is a thin layer of low-k material. Low-k dielectric layer 22 is a spin on deposit of materials such as HSQ, SOG, BCB, or other suitable materials. The low-k dielectric materials are deposited using spin on deposit techniques in which the materials are dissolved in a solvent and spun on to the integrated circuit being assembled. Alternatively chemical vapor deposition (CVD) techniques may be used or any other deposition techniques that are known to those of ordinary skill in the art of semiconductor fabrication.

After the thin layer of low-k dielectric 22 has been deposited over metal lines 20, the dielectric is electron beam cured. The electron beam used has a dose of between 1500 and 6000 micro coulombs per square centimeter ($\mu c/cm^2$) at about 1 to 3 kiloelectron volts (KeV). Electron beam curing of low-k dielectric layer 22 adds mechanical strength to the low-k dielectric itself and therefore adds mechanical support to conductive lines 20. Further, the electron beam cured low-k dielectric 22 adds moisture resistance to conductive lines 20. Because low-k dielectric layer 22 is electron beam cured, the dielectric constant of the material is increased. However, because low-k dielectric layer 22 is a thin layer, on the order of 0.03 micrometers, in a preferred embodiment, the overall parasitic capacitance between the conductive lines is not radically increased. Therefore, the process of depositing an electron beam cured low-k dielectric over conductive lines 20 and then applying a thicker layer of low-k dielectric that is thermally cured in a conventional method, as shown in FIG. 1, the overall aggregate parasitic capacitance is raised only slightly.

Low-k dielectric layer 24 is conventionally heat cured in a temperature range of approximately 300 to 400° C. Further, the dielectric constant of low-k dielectric materials has a range of approximately 2.0 to 4.0 for materials, such as SOG, BCB, and HSQ when heat cured.

Electron beam curing of thin layer 22 adds thermal resistance to layer 22. This is an important advantage because when layer 24 is heat cured, it is desirable for layer 22 to avoid any further curing which would tend to change the desirable material properties of layer 22 obtained by electron beam curing. Electron beam curing of low-k dielectric materials can improve the thermal stability of the material by about 10 to 45 percent.

Figure 5:
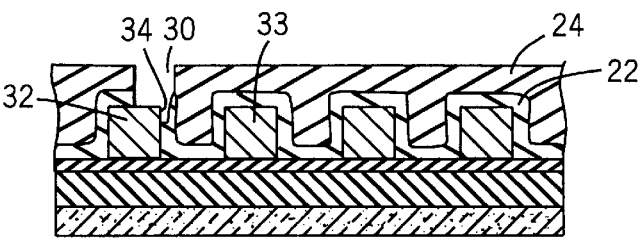
FIG. 5 is a cross sectional view of the portion of FIG. 1 having a via etched over one of the conductive lines and showing how the etch penetrates the thin dielectric layer.
Figure 6:
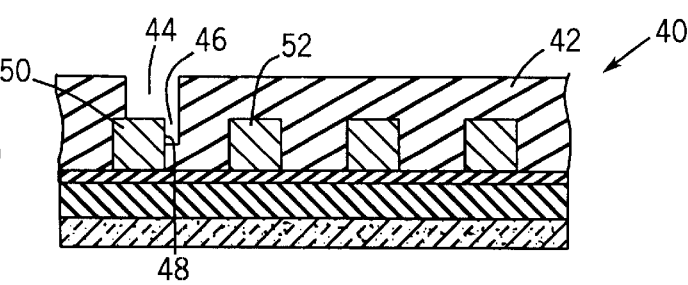
FIG. 6 is a cross sectional view of a portion of an integrated circuit having conductive lines with a single dielectric layer over the conductive lines and showing a via etched in the dielectric layer.

Because the electron beam cured low-k dielectric layer 22 has different etch properties than heat cured low-k dielectric layer 24, misaligned vias/contacts will not etch against the side walls of conductive lines 20 as much as if electron beam cured low-k dielectric layer 22 did not exist or if $SiO_2$ dielectric is used as a thin layer over conductive lines 20 and a low-k dielectric is used as gapfill overlying the thin layer. Referring to FIG. 5 a via 30 is shown etched through dielectric layer 24. As depicted, via 30 is slightly misaligned with conductive line 32. In such a case of misalignment, it is undesirable to etch the dielectric layer deep along the side wall 34 of metal conductive line 32. As depicted in FIG. 6, an integrated circuit 40 is shown having only a single dielectric layer 42, dielectric layer 42 being a heat cured low-k dielectric layer. In this case, a misalignment of a via 44 causes a deep cut 46 along side wall 48 of metal conductive line 50. A deep cut such as cut 46 causes a smaller volume of low-k dielectric between conductive lines 50 and 52. Therefore, the yield loss due to the metal-metal bridging during subsequent processing may be caused. Presence of the e-beam cured low-k dielectric layer 22 between conductive lines 20 significantly reduces the deep via formation due to its inherent low etch rate thus significantly improving yield and manufacturing margin.

As depicted in FIG. 5, because low-k dielectric layer 22 has different etching properties than heat cured dielectric layer 24, a smaller cut along side wall 34 is produced by the via misalignment and therefore the amount of material removed between conductive lines 32 and 33 is only slightly decreased, thus the yield loss due to metal-metal bridging during subsequent processing is limited.

It is understood that, while the detailed drawings and examples given describe preferred exemplary embodiments of the present invention, they are for the purposes of illustration only. The method and apparatus of the invention is not limited to the precise details and conditions disclosed. For example, it is not limited to the specific materials or apparatuses but only to their specific characteristics, such as being an insulating material with a dielectric constant of not greater than four and being capable of being electron beam cured or of being heat cured. Various changes may be made to the details disclosed without departing from the spirit of the invention, which is defined by the following claims.

What is claimed is:

1. A method of making an insulating material on an integrated circuit, the integrated circuit having a substrate, a dielectric stack formed above the substrate, and at least one conductive metal line overlying the dielectric stack, the method comprising:

conformally depositing a first layer of low-k dielectric material directly over the at least one conductive metal line;

exposing the first layer of low-k dielectric to an electron beam; and depositing a second layer of low-k dielectric material to cover the first layer of low-k dielectric material.

2. The method of claim 1 further comprising heating the second low-k dielectric material layer.

3. The method of claim 2 wherein the first low-k dielectric layer is thinner than the second low-k dielectric layer.

4. The method of claim 3 wherein the at least one conductive metal lines are substantially one of aluminum and aluminum alloy.

5. The method of claim 3 wherein the at least one conductive metal lines are substantially one of copper and copper alloy.

6. The method of claim 3 wherein the first layer of low-k dielectric material is selected from the group of materials consisting of spin on glass (SOG), benzocyclobutine (BCB), and hydrogen silsesquioxanes (HSQ).

7. The method of claim 3 wherein the dielectric stack comprises:

a third low-k dielectric layer over the silicon substrate; and a fourth low-k dielectric layer over the third low-k dielectric layer.

8. The method of claim 7 wherein the third low-k dielectric layer is thermally cured and the fourth low-k dielectric layer is electron beam cured.

9. The method of claim 8 wherein the third low-k dielectric layer is thinner than the fourth low-k dielectric layer.

10. A method of forming an insulating material on a patterned surface of conductive lines separated by gaps and formed on a substrate, the method comprising:

depositing a first layer of low-k dielectric material around the metal lines;

curing the first layer of low-k dielectric material by exposing the low-k dielectric material to an electron beam (E-beam); and depositing a second layer of low-k dielectric material over the first layer of low-k dielectric material.

11. The method of claim 10 wherein the first layer of low-k dielectric material is selected from the group of materials consisting of spin on glass (SOG), benzocyclobutine (BCB), hydrogen silsesquioxanes (HSQ).

12. The method of claim 10 wherein the conductive lines are substantially one of aluminum and aluminum alloy.

13. The method of claim 10 wherein the conductive lines are substantially one of copper and copper alloy.

14. The method of claim 10 wherein the first layer of low-k dielectric provides moisture resistance and mechanical support to the metal lines, with a substantially small impact on the overall parasitic capacitance between the conductive lines.

15. The method of claim 10 further comprising curing the second layer of low-k dielectric material by heating.

16. The method of claim 10:

wherein the first layer of low-k dielectric material is thinner than the second layer of low-k dielectric material.

17. A method of forming an integrated circuit on a dielectric stack, the dielectric stack including a silicon substrate underlying a first layer of low-k dielectric, the first layer of low-k dielectric underlying an electron beam (E-beam) cured second layer of low-k dielectric, the method comprising:

forming conductive lines on the dielectric stack by a selective etching process;

depositing a third layer of low-k dielectric material around the metal lines;

curing the third layer of low-k dielectric material by exposing the third layer of low-k dielectric material to an electron beam; and depositing a fourth layer of low-k dielectric material over the third layer of low-k material.

18. The method of claim 17 wherein the third layer of low-k dielectric provides moisture resistance and mechanical support to the conductive lines, with a substantially small impact on the overall parasitic capacitance between the conductive lines.

19. The method of claim 17 further comprising curing the fourth layer of low-k dielectric material by heating.

20. The method of claim 19 wherein the third layer of low-k dielectric material is thinner than the fourth layer of low-k dielectric material.

21. The method of claim 19 wherein the electron beam dose is 1500 to 6000 micro coulombs per square centimeter at 1 to 3 Kiloelectron volts (KeV).

* * * * *

UNITED STATES PATENT AND TRADEMARK OFFICE
CERTIFICATE OF CORRECTION

PATENT NO. : 6,169,039 B1  Page 1 of 1
DATED : January 2, 2001
INVENTOR(S) : Lin et al.

It is certified that error appears in the above-identified patent and that said Letters Patent is hereby corrected as shown below:

Column 5,
Line 54, after "beam" please add -- (E-beam) --.

Column 6,
Line 21, after "metal lines" please add -- , the first layer having trenches corresponding to the gaps --.
Line 27, after "dielectric material" please add -- , the second layer filling the trenches --.
Line 54, after "etching process" please add -- , the conductive lines being separated by gaps --.
Line 55, before "depositing" please add -- conformally --.
Line 55, after "dielectric material" please add -- directly above and --.
Line 56, after "metal lines" please add -- , the third layer having trenches corresponding to the gaps --.

Signed and Sealed this

Twenty-fifth Day of December, 2001

Attest:

JAMES E. ROGAN
Attesting Officer   Director of the United States Patent and Trademark Office